United States Patent
Lee et al.

(10) Patent No.: US 8,130,174 B2
(45) Date of Patent: Mar. 6, 2012

(54) ORGANIC ELECTROLUMINESCENT DISPLAY DEVICE

(75) Inventors: Hun-Jung Lee, Anyang-si (KR); Jae-Bon Koo, Yongin-si (KR); Sang-Il Park, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1096 days.

(21) Appl. No.: 10/922,915

(22) Filed: Aug. 23, 2004

(65) Prior Publication Data
US 2005/0057460 A1  Mar. 17, 2005

(30) Foreign Application Priority Data
Aug. 25, 2003 (KR) .................. 10-2003-0058871

(51) Int. Cl.
*G09G 3/30* (2006.01)
(52) U.S. Cl. ............................. 345/76; 345/82
(58) Field of Classification Search .............. 345/45, 345/76–82
See application file for complete search history.

(56) References Cited

U.S. PATENT DOCUMENTS

| | | | | |
|---|---|---|---|---|
| 5,734,455 A * | 3/1998 | Yoshida et al. | .................. | 349/99 |
| 5,926,242 A * | 7/1999 | Kataoka et al. | ............... | 349/117 |
| 6,300,152 B1 * | 10/2001 | Kim | .................................. | 438/30 |
| 6,674,495 B1 * | 1/2004 | Hong et al. | ...................... | 349/43 |
| 2001/0033346 A1 * | 10/2001 | Sato et al. | ......................... | 349/43 |
| 2002/0024298 A1 * | 2/2002 | Fukunaga | ....................... | 313/506 |
| 2002/0047514 A1 * | 4/2002 | Sakurai et al. | ................ | 313/503 |
| 2002/0070381 A1 * | 6/2002 | Yamada et al. | .................. | 257/59 |
| 2002/0101394 A1 * | 8/2002 | Anzai | .............................. | 345/76 |
| 2003/0128173 A1 * | 7/2003 | Ko | .................................. | 345/82 |

FOREIGN PATENT DOCUMENTS

| | | |
|---|---|---|
| JP | 2002-032037 | 1/2002 |
| JP | 2003-229283 | 8/2003 |
| KR | 1020030054798 | 7/2003 |

* cited by examiner

*Primary Examiner* — Yong H Sim
(74) *Attorney, Agent, or Firm* — H.C. Park & Associates, PLC

(57) ABSTRACT

The present invention relates to an organic electroluminescent display device for preventing a voltage drop and a short between power supply elements by simultaneously forming a reflective film and a power supply element using a low resistance metal. The invention provides an organic electroluminescent display device comprising gate lines, data lines and a power supply element formed on an insulating substrate, a pixel region limited by the gate lines, the data lines and the power supply element, and pixels arranged on the pixel region and comprising of a reflective film and a pixel electrode, wherein the reflective film is formed on the same layer as the power supply element.

12 Claims, 9 Drawing Sheets

ORGANIC ELECTROLUMINESCENT DISPLAY DEVICE

CROSS REFERENCE

This application claims the benefit of Korean Patent Application No. 2003-58871, filed on Aug. 25, 2003, the disclosure of which is incorporated herein by reference in its entirety.

FIELD OF THE INVENTION

The present invention relates to an organic electroluminescent display device, and more particularly, to an organic electroluminescent display device for preventing a voltage drop and a short between power supply elements by simultaneously forming a reflective film and a power supply element using a low resistance metal.

BACKGROUND OF THE INVENTION

Ordinarily, each unit pixel of an active matrix organic electroluminescent display device comprises a switching transistor, a driving transistor, a capacitor and a light emitting element. A common power supply (Vdd) is supplied to the driving transistor and the capacitor from the power supply line. A common power supply should be uniformly supplied to a plurality of pixels arranged in a matrix form so as to obtain uniform luminance, since the power supply line plays a role in controlling an electric current flowing to the light emitting element through the driving transistor. Referring to the following appended drawings, prior art is now described.

FIG. 1 is a cross sectional view illustrating a conventional organic electroluminescent display device. Referring to FIG. 1, an activation layer 120, formed of polysilicon, is formed on a buffer layer 110 which is formed on insulating substrate 100.

Then, a gate electrode 140 is formed by depositing gate insulating layer 130 and gate metal on the front side of the insulating substrate 100 and patterning the gate metal.

Source region 121 and drain region 125 are formed by doping certain impurities in the activation layer 120 by using a mask after forming the gate electrode 140. A region between the source region 121 and the drain region 125 in the activation layer 120 functions as a channel region 123.

Afterward, contact holes 151, 155 for exposing a part of the source region 121 and drain region 125 are formed by depositing an interlayer insulating layer 150 on the source region 121 and drain region 125 and patterning the interlayer insulating layer 150. Source and drain electrodes 161, 165 are formed by depositing a metal layer on the front side of the insulating substrate 100 and photolithgraphing the metal layer. Any one electrode in the source and drain electrodes 161, 165, such as, for example, the source electrode 161, functions as a power supply line.

A via hole 175 for exposing a part of the drain electrode 165 is formed on the passivation layer 170 after forming a passivation layer 170 on the front side of the insulating substrate 100 including the source and drain electrodes 161, 165.

An anode electrode 180 consisting of a reflective film 181 and a transparent electrode 183 is formed by patterning the deposited metal and transparent conductive material after depositing a metal, such as Ag and Al, having a superior reflectivity to that of the insulating substrate 100, on the via hole 175 and depositing a transparent conductive material, such as ITO and IZO, on the deposited metal.

An organic emitting layer and a cathode electrode are formed afterward, although they are not illustrated on drawings.

A power supply line is ordinarily formed using source and drain electrodes 161, 165 in the foregoing conventional organic electroluminescent display device. However, the conventional organic electroluminescent display device has problems in that MoW, mainly used as the source and drain electrodes 161, 165, has a high voltage drop (IR drop) due to high resistance, and a short may be generated between adjacent wirings when the source and drain electrodes 161, 165 are used as a power supply line.

SUMMARY OF THE INVENTION

Therefore, in order to solve the foregoing problems of the prior art, the present invention provides an organic electroluminescent display device for preventing a voltage drop and a short circuit between power supply elements by simultaneously forming a reflective film and a power supply element using a low resistance metal, and a method for fabricating the same.

An exemplary embodiment of the invention provides an organic electroluminescent display device comprising gate lines, data lines and a power supply element formed on an insulating substrate, a pixel region confirmed by the gate lines, data lines and the power supply element, and pixels arranged on the pixel region and comprising of at least a reflective film and a pixel electrode, wherein the reflective film is formed on the same layer as the power supply element.

A further exemplary embodiment of the invention provides an organic electroluminescent display device comprising a thin film transistor formed on an insulating substrate and equipped with a source electrode and a drain electrode, a first insulating layer formed on the insulating substrate and equipped with a contact hole for exposing any one electrode in the source electrode and the drain electrode, a reflective film formed on the first insulating layer, a power supply element formed on the first insulating layer and electrically connected to any one electrode of the source electrode and the drain electrode through the contact hole, a second insulating layer formed on the insulating substrate equipped with the reflective film and the power supply element and equipped with a via hole for exposing another electrode of the source electrode and the drain electrode, and a pixel electrode formed on the second insulating layer and electrically connected to another electrode of the source electrode and the drain electrode through the via hole.

A further embodiment of the present invention provides an organic electroluminescent display device comprising a thin film transistor formed on an insulating substrate and equipped with source electrode and a drain electrode, a first insulating layer formed on the insulating substrate and equipped with a contact hole for exposing the source electrode and the drain electrode, a first pixel electrode formed on the first insulating layer and electrically connected to any one electrode of the source electrode and the drain electrode, a power supply element formed on the first insulating layer and electrically coupled to another electrode of the source electrode and the drain electrode through the contact hole, a second insulating layer formed on the insulating substrate equipped with the first pixel electrode and the power supply element and equipped with a via hole for exposing a part of the first pixel electrode, and a second pixel electrode formed on the second insulating layer and electrically coupled to the first pixel electrode through the via hole.

In a further exemplary embodiment of the present invention, the power supply element may be formed on a layer different from the gate lines and the data lines.

Furthermore, an insulating layer may be interposed between the reflective film and the power supply element so that the reflective film and the power supply element are electrically separated from each other.

Furthermore, an insulating layer may be interposed between the first pixel electrode and the power supply element in such a way that the first pixel electrode and the power supply element are electrically connected to each other through a via hole.

Furthermore, the power supply element and at least one of the reflective film and the first pixel electrode are formed of the same material, such as a metal having a low resistance. The reflective film and power supply element may have a thickness of a range between about 1,000 Å and about 5,000 Å.

Furthermore, the power supply element may be formed in a linear or in a grid structure.

Furthermore, the first insulating layer may be a passivation layer, the second insulating layer may be a planarized film, the second insulating layer may be formed of a transparent organic material, such as, for example, acryl, PI, PA, BCB or similar material, and the second insulating layer may have a thickness of a range of between about 1 μm to about 2 μm.

BRIEF DESCRIPTION OF THE DRAWINGS

The above and other features and advantages of the present invention will become more apparent to those of ordinary skill in the art by describing in detail exemplary embodiments thereof with reference to the attached drawings.

DETAILED DESCRIPTION OF THE INVENTION

Figure 1:
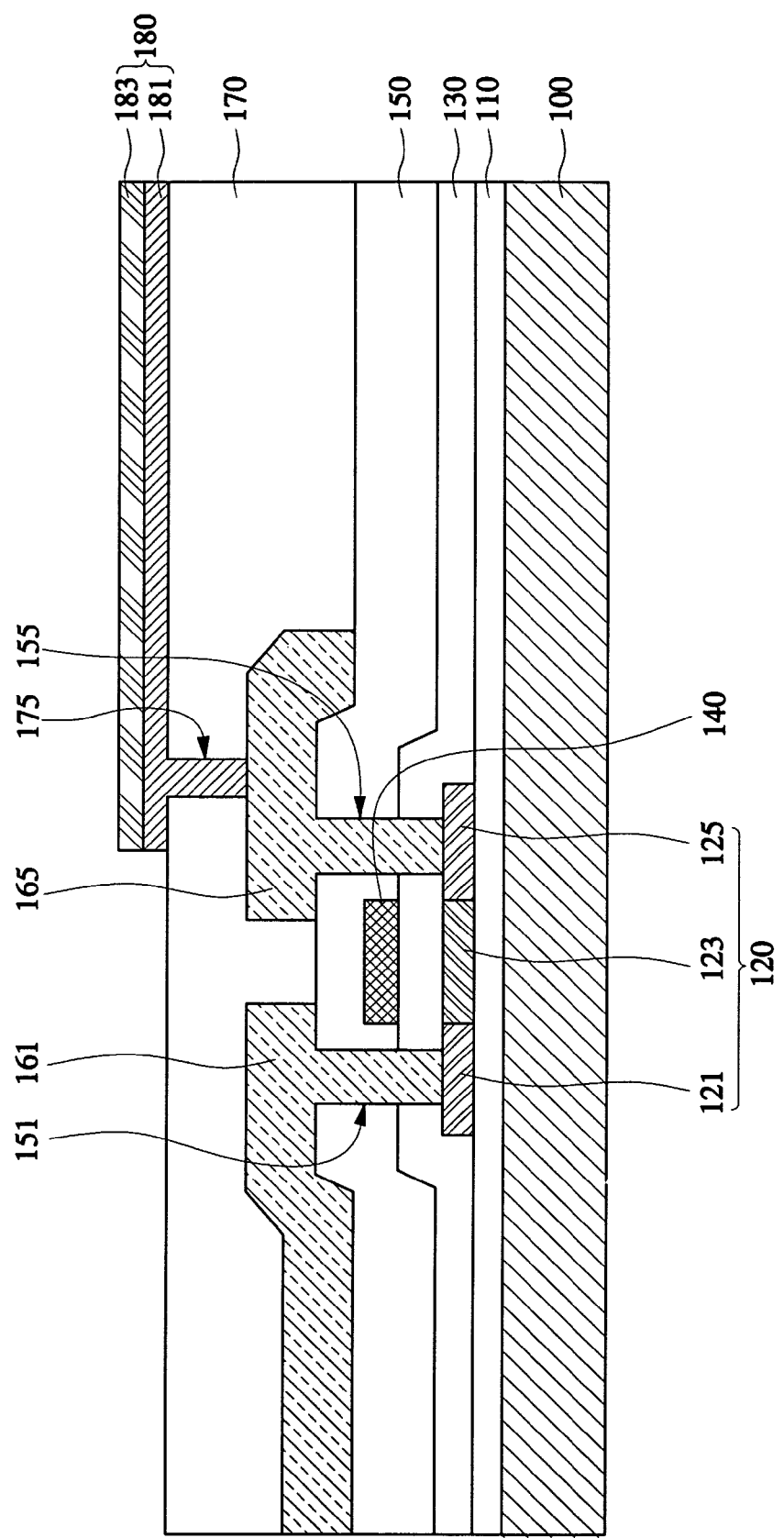
FIG. 1 is a cross sectional view illustrating a conventional organic electroluminescent display device.

The present invention will now be described in detail in connection with exemplary embodiments with reference to the accompanying drawings. For reference, like reference characters designate corresponding parts throughout several views.

Figure 2A:
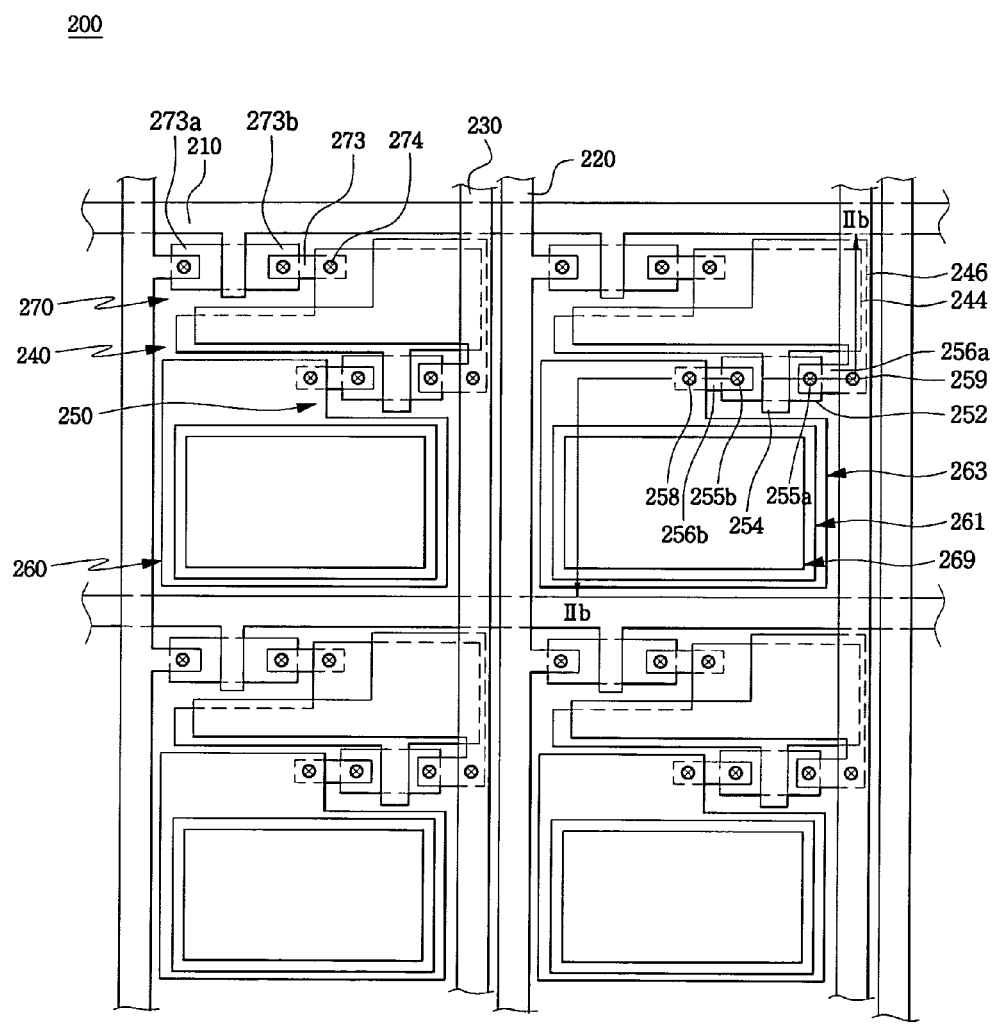
FIG. 2A is a plane figure of an organic electroluminescent display device according to one embodiment of the present invention.
Figure 2B:
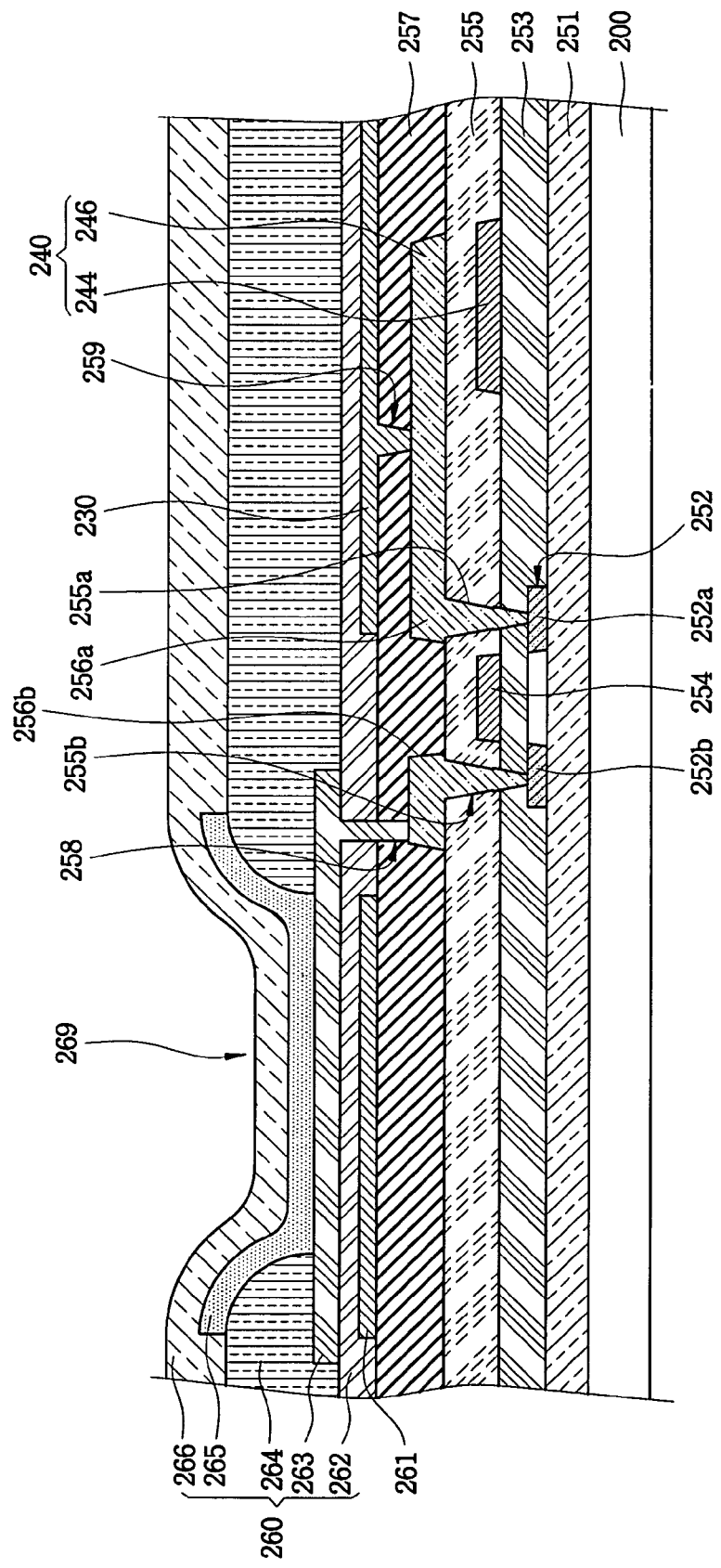
FIG. 2B is a cross sectional view of an organic electroluminescent display device taken along the line II B-II B of FIG. 2A.

FIG. 2A illustrates a planar structure of an organic electroluminescent display device according to an exemplary embodiment of the present invention, and FIG. 2B illustrates cross sectional structure of the organic electroluminescent display device. FIG. 2B illustrates a driving thin film transistor, an electroluminescent (EL) device and a capacitor in pixels in the cross sectional structure of an organic electroluminescent display device taken along the line II b-II b of FIG. 2A.

Referring to FIG. 2A and FIG. 2B, an active matrix organic electroluminescent display device according to an exemplary embodiment comprises a plurality of gate lines 210 formed on an insulating substrate 200, a plurality of data lines 220 formed on the insulating substrate 200 so that the data lines 220 and the gate lines 210 cross each other, a power supply element 230 for supplying a common power supply, and a plurality of pixels connected to the signal lines 210, 220 and the power supply element 230.

Each of the pixel comprises a switching thin film transistor 270 connected to the gate lines 210 and data lines 220, a capacitor 240 connected to the power supply element 230 through via hole 259, and a driving thin film transistor 250 and an EL device 260 connected to the power supply element 230 through the via hole 259.

An upper electrode 246 and a lower electrode 244 of the capacitor 240 are formed in an island shape at upper and lower parts of an interlayer insulating layer 255 respectively. The lower electrode 244 of the capacitor 240 is connected to gate electrode 254 of the driving thin film transistor 250 and connected to any one of the source electrode 273a and the drain electrode 273b of the switching thin film transistor 270. For example, the lower electrode 244 is connected to the source electrode 273a through contact hole 274. The upper electrode 246 of the capacitor 240 is connected to the power supply element 230 through the via hole 259. A reflective film 261 of the EL device 260 is formed on the same layer as the power supply element 230, such as, for example, on first insulating layer 257, and is insulated from other layers by second insulating layer 262.

A pixel electrode 263 of the EL device is formed on the second insulating layer 262 in such a way that the pixel electrode 263 is coupled to any one electrode of source electrode 256a and the drain electrode 256b of the driving thin film transistor 250. For example, the pixel electrode may be connected to the drain electrode 256b through via hole 258. An insulating layer formed of an interlayer insulating layer 255 may be interposed between the gate lines 210 and the data lines 220 so that the gate lines 210 and the data lines 220 are electrically separated from each other. An insulating layer, formed of first insulating layer 257 and gate insulating layer 253, is interposed between the power supply elements 230 so that the power supply elements 230 are electrically separated from the gate lines 210 and data lines 220. Therefore, the power supply elements 230 are formed on the same layer as the reflective film 261, that is, formed on the first insulating layer 257. The power supply elements 230 are formed on layers different from the gate lines 210 or data lines 220 so that an in-line short may be prevented.

A method for fabricating an organic electroluminescent display device of the present invention having the foregoing structure is described as follows.

An activation layer 252 formed of polysilicon film is formed on a buffer layer 251 formed on insulating substrate 200. A gate electrode 254 is formed by forming a gate insulating layer 253 on the buffer layer 251 and on the activation layer 252, depositing gate metal on the gate insulating layer 253 and patterning the gate metal after forming the activation layer 252. Source and drain regions 252a, 252b are formed by injecting certain impurities into the activation layer 252, using the gate electrode 254 as a mask after forming the gate electrode 254.

Contact holes 255a, 255b for exposing a part of the source region 252a and the drain region 252b are formed by depositing an interlayer insulating layer 255 on the source and drain regions 252a, 252b and patterning the interlayer insulating layer 255 after forming the source and drain regions 252a, 252b.

A thin film transistor comprising an activation layer 252, a gate electrode 254 and source and drain electrodes 256a, 256b is formed by depositing a metallic material on the front side of the insulating substrate 200 and patterning the metallic material, thereby forming source and drain electrodes 256a, 256b electrically connected to the source and drain regions 252a, 252b through the contact holes 255a, 255b, after forming the contact holes 255a, 255b.

A via hole 259 for exposing a part of any one electrode of the source and drain electrodes 256a, 256b, such as, for example, the source electrode 256a, is formed by forming a first insulating layer 257 on the front side of the insulating substrate 200, including on the thin film transistor, and etching the first insulating layer 257, wherein the first insulating layer 257 is formed using an inorganic material such as, for example, SiNx, SiO2 or similar material and functions as a passivation layer.

A reflective film 261, for playing a role in reflecting light emitted from an organic emitting layer to be formed afterward, and a power supply element 230, electrically coupled to the source electrode 256a through the via hole 259, are formed at the same time by depositing a metallic material having a lower resistance and superior reflectivity on the front side of the insulating substrate 200 and patterning the metallic material after forming the via hole 259. The reflective film 261 and the power supply element 230 may be formed of a metal having superior reflectivity and lower resistance. For example, the reflective film 261 and the power supply element 230 may be formed of a metal such as Al, Ag or similar material. Furthermore, the reflective film 261 and power supply element 230 may have a thickness of a range of about 1,000 Å to about 5,000 Å.

A via hole 258 for exposing a part of another electrode of the source and drain electrodes 256a, 256b, such as, for example, the drain electrode 256b, is formed on the second insulating layer 262 by forming a second insulating layer 262 on the front side of the insulating substrate 200 and patterning the second insulating layer 262, after simultaneously forming the reflective film 261 and the power supply element 230. The second insulating layer 262 may function as a planarization layer and may be formed of a material such as, for example, acryl, PI (polyinide), PA (polyamide), BCB (benzocyclobutene) or similar material that is transparent and has fluidity, so that the material is capable of planarizing the lower structure by relieving winding of a lower structure. The second insulating layer 262 may be deposited to a thickness of a range of about 1 μm to about 2 μm to provide sufficient planarization and transmittance of light emitted from an organic emitting layer to be formed afterward.

A pixel electrode 263 electrically coupled to another of the source and drain electrodes 256a, 256b is formed by depositing a transparent conductive material, such as, for example, ITO, IZO, or similar material on the front side of the insulating substrate 200 and patterning the transparent conductive material after forming the via hole 258.

An EL device 260 may be completed by forming a pixel defining film 264, an organic emitting layer 265, and a cathode electrode 266. The pixel defining film 264 is formed on the pixel electrode 263 and equipped with an opening part 269 for exposing a part of the pixel electrode 263.

A front emitting type organic electroluminescent display device is formed by sealing the insulating substrate 200 using a sealing substrate, after forming the EL device 260, although the sealing substrate is not illustrated in the figures.

Figure 3A:
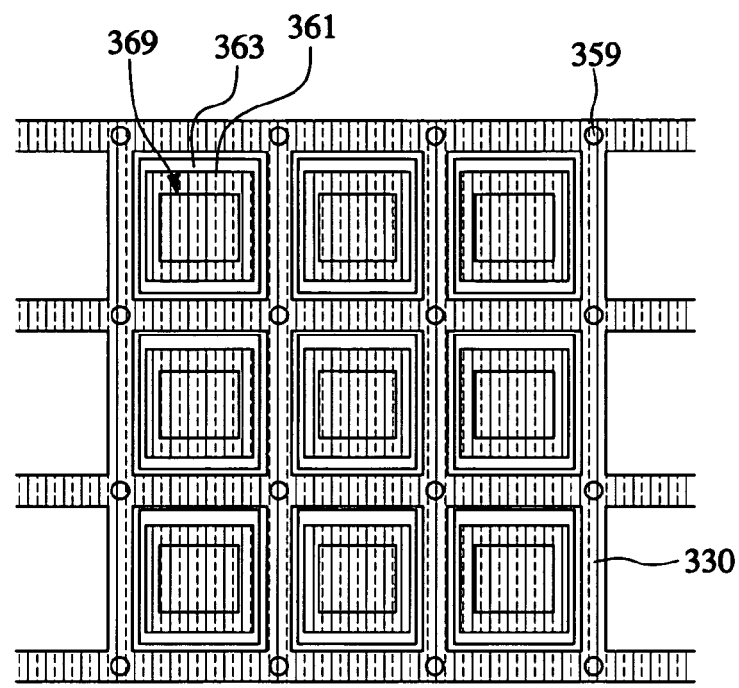
FIG. 3A, FIG. 3B, and FIG. 3C are plane figures illustrating a reflective film and power supply element according to embodiments of the present invention.
Figure 3B:
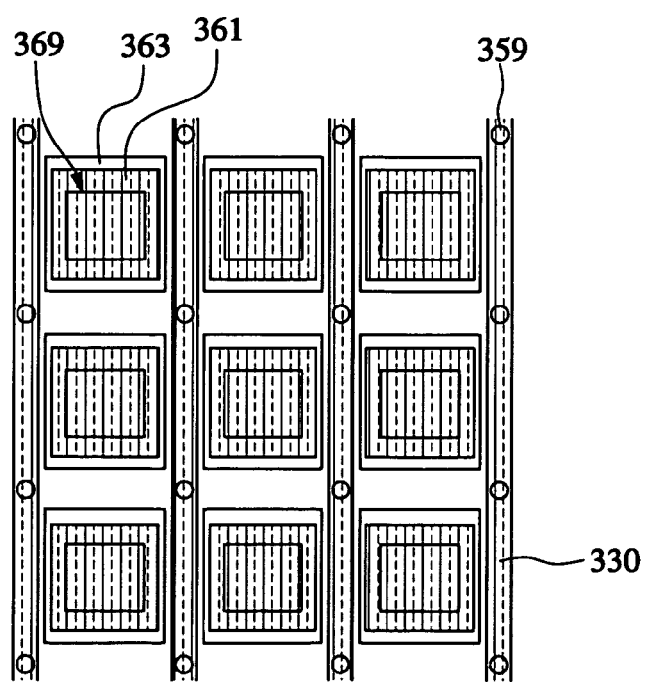
Figure 3C:
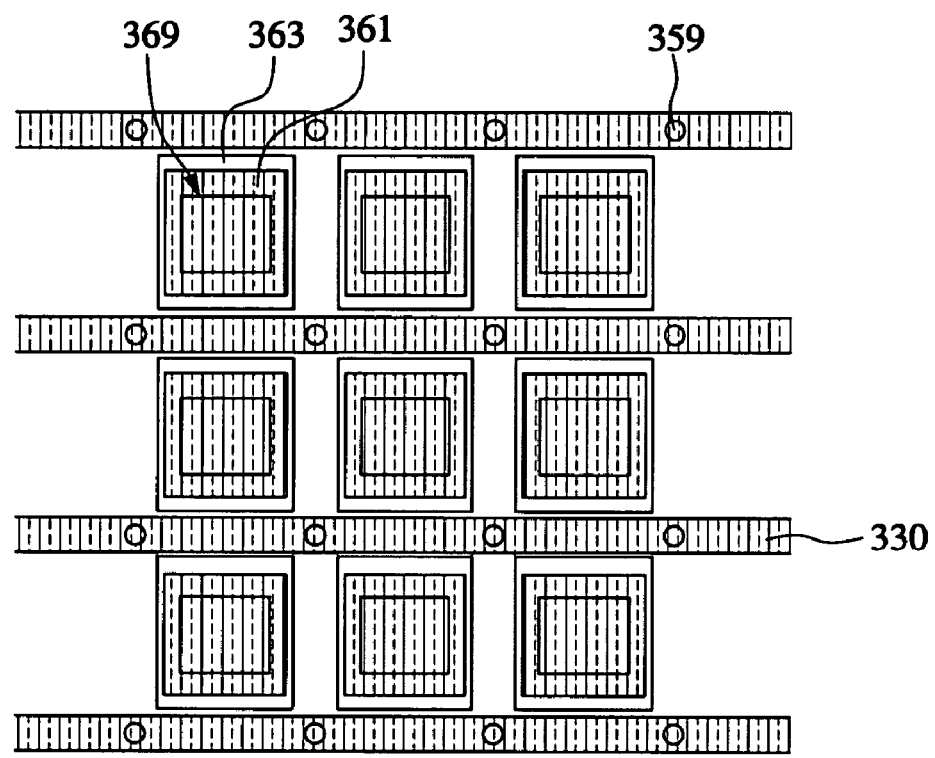

FIG. 3A, FIG. 3B and FIG. 3C illustrate a planar structure of a reflective film 361 and a power supply element 330 according to exemplary embodiments of the present invention.

In FIG. 3A, the reflective film 361 is formed such that the reflective film 361 is included in an island shape inside respective grids of the power supply element 330. A voltage drop effect through the power supply element 330 is suppressed, since the power supply voltage (Vdd) is impressed from four directions if the power supply element 330 is formed in a grid shape as described above.

Furthermore, the island shape reflective films 361 may be arranged in a matrix shape of rows and columns, and the power supply element 330 is formed in a line shape between adjacent reflective films 361 arranged in a column direction, as illustrated in FIG. 3B.

Also, the power supply element 330 may be formed in a line direction between the island shape adjacent reflective films 361 arranged in a matrix shape of rows and columns, as illustrated in FIG. 3C.

Figure 4A:
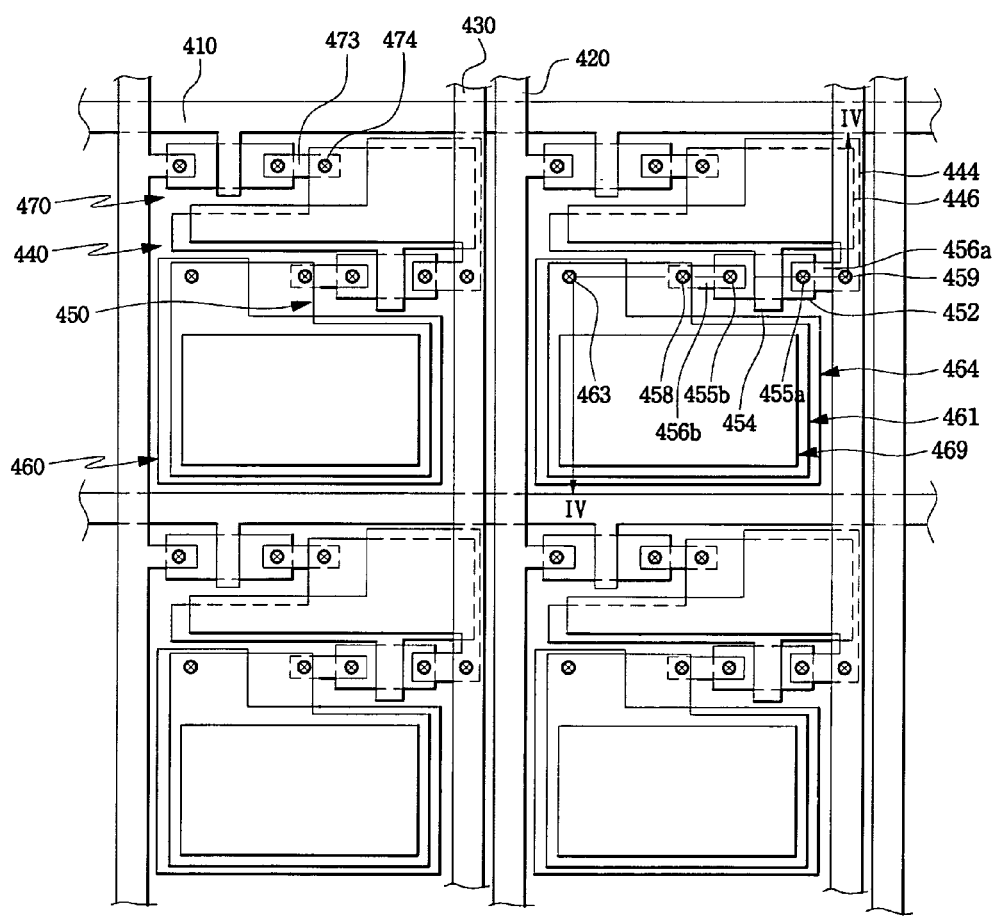
FIG. 4A is a plane figure of an organic electroluminescent display device according to another embodiment of the present invention.
Figure 4B:
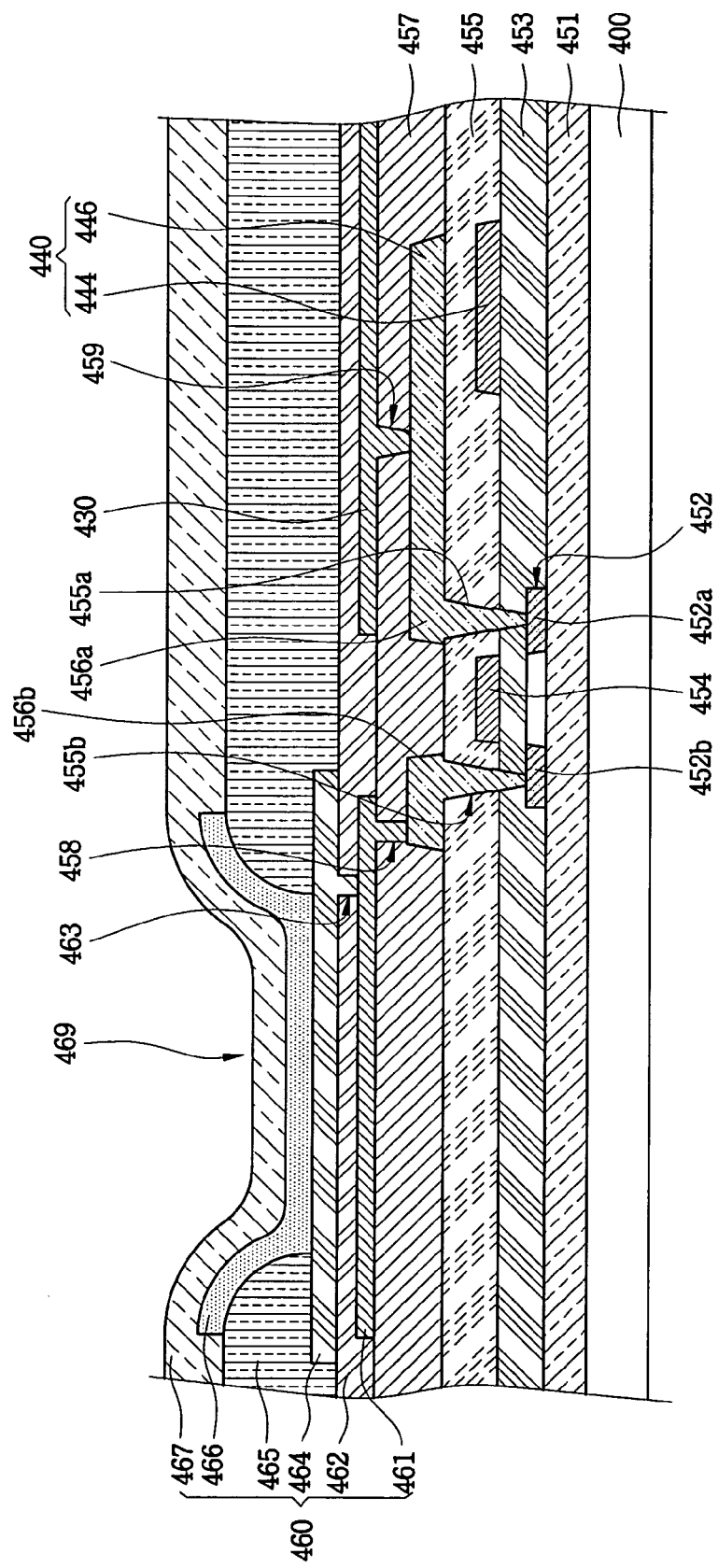
FIG. 4B is a cross sectional view of an organic electroluminescent display device taken along the line IVB-IVB of FIG. 4A.

FIG. 4A illustrates a planar structure of an organic electroluminescent display device according to another exemplary embodiment of the present invention, and FIG. 4B illustrates a cross sectional structure of the organic electroluminescent display device. FIG. 4B illustrates a cross sectional structure of an organic electroluminescent display device, taken along the line IV-IV of FIG. 4A, which includes a driving thin film transistor, an EL device and a capacitor in pixels.

An active matrix organic electroluminescent display device illustrated in FIG. 4A and FIG. 4B may be structurally similar to an active matrix organic electroluminescent display device of the exemplary embodiment described above, except that the reflective film and the pixel electrode are electrically connected to each other. The active matrix organic electroluminescent display device illustrated in FIG. 4A and FIG. 4B comprises a reflection type first pixel electrode 461 and a transmission type second pixel electrode 464. The reflection type first pixel electrode 461 is connected to source and drain electrodes 456a, 456b of the lower side.

That is, first pixel electrode 461 of an EL device 460 is formed on the same layer as a power supply element 430, such as, for example, first insulating layer 457. The first pixel electrode 461 is connected to any one electrode of the source and drain electrodes 456a, 456b of the driving transistor, such as, for example, the drain electrode 456b, through contact hole 458 of the first insulating layer in an active matrix organic electroluminescent display device according to an exemplary embodiment of the invention, as illustrated in FIG. 4A and FIG. 4B.

Furthermore, a second pixel electrode 464 of the EL device is formed on a second insulating layer 462 so that the second pixel electrode 464 is electrically connected to first pixel electrode 461 through via hole 463.

Figure 5A:
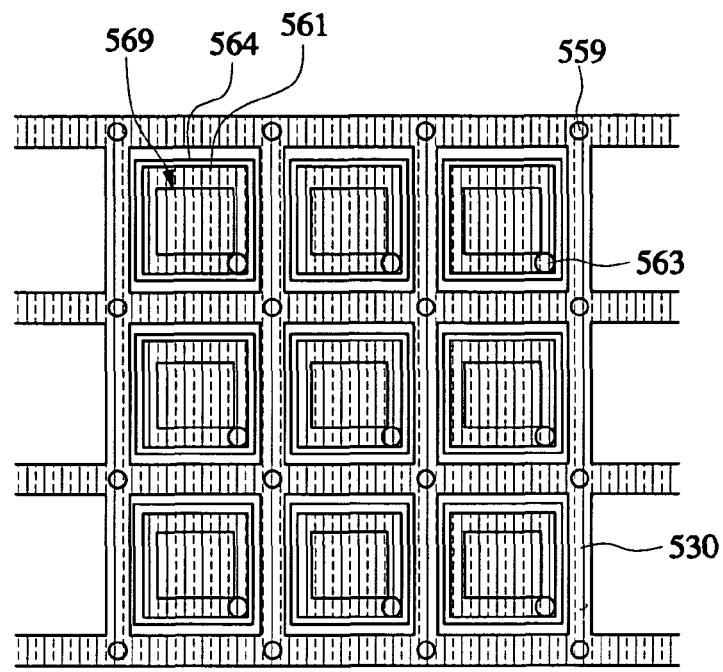
FIG. 5A, FIG. 5B, and FIG. 5C are plane figures for illustrating a first pixel electrode and power supply element according to preferred embodiments of the present invention.
Figure 5B:
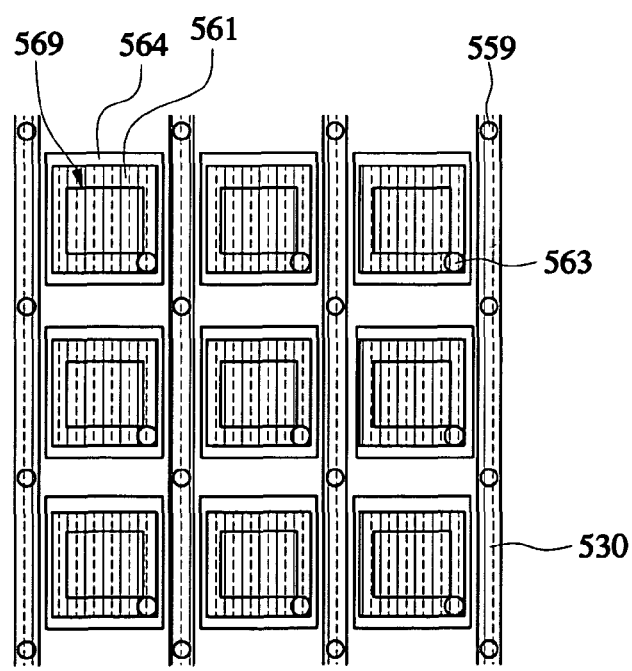
Figure 5C:
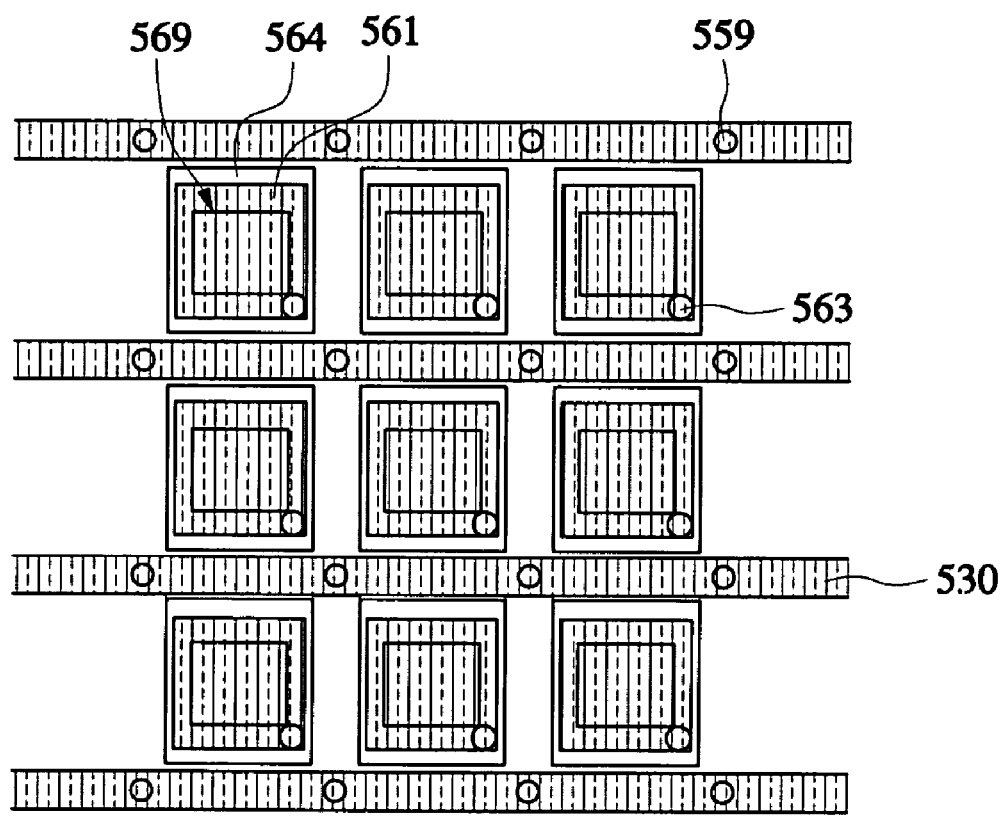

FIG. 5A, FIG. 5B, and FIG. 5C illustrate a planar structure of first pixel electrodes 561 and a power supply element 530 according to an exemplary embodiment of the present invention.

In FIG. 5A, the first pixel electrodes 561 are formed such that the first pixel electrodes 561 are included in an island shape inside respective grids of the power supply element 530, and the power supply element 530 is formed in a grid shape.

Furthermore, the island shape first pixel electrodes 561 may be formed in a matrix shape of rows and columns, and the power supply element 530 is formed in a line shape between adjacent first pixel electrodes 561 arranged in a column or row direction, as illustrated in FIG. 5B and FIG. 5C.

As described above, an in-line short problem between the gate and data lines and the power supply elements may be solved or reduced by simultaneously forming the power supply elements 230 and a reflective film 261 or a first pixel electrode 461. Furthermore, a voltage drop effect may be suppressed by using a lower resistance metal as the reflective film 261, the first pixel electrode 461, and/or the power supply element 230.

Additionally, the width of the power supply element can be widened by reducing or solving the potential problem of an in-line short generated between the gate lines and the data lines.

According to the foregoing exemplary embodiments, the present invention may be capable of providing an organic electroluminescent display device for preventing short circuits between power supply elements or between the power supply elements and other adjacent lines by simultaneously forming the power supply elements together with a reflective film or a first pixel electrode.

Furthermore, the present invention is capable of providing an organic electroluminescent display device for suppressing a voltage drop effect by using a lower resistance metal as a material for a reflective film, a first pixel electrode and/or as the power supply elements.

While the invention has been particularly shown and described with reference to exemplary embodiments thereof, it will be understood by those skilled in the art that changes in form and details may be made to the foregoing without departing from the spirit and scope of the invention.

What is claimed is:

1. An organic electroluminescent display device, comprising:
   a thin film transistor formed on an insulating substrate and having a source electrode and a drain electrode;
   a first insulating layer formed on the insulating substrate having the thin film transistor and having at least one contact hole for exposing one of the source electrode and the drain electrode disposed below the first insulating layer;
   a reflective film formed on the first insulating layer;
   a power supply line formed on the first insulating layer and electrically connected to one of the source electrode and the drain electrode through the at least one contact hole;
   a second insulating layer formed on the insulating substrate having the reflective film and the power supply line, the first insulating layer and the second insulating layer having a via hole for exposing the other of the source electrode and the drain electrode; and
   a pixel electrode formed on the second insulating layer and electrically connected to the other of the source electrode and the drain electrode, which the power supply line is not electrically connected to, through the via hole in the first insulating layer and the second insulating layer,
   wherein the power supply line is not formed directly on the same layer as a plurality of gate lines, and the power supply line is not formed directly on the same layer as a plurality of data lines,
   wherein the via hole in the first insulating layer and the second insulating layer comprises a first via hole in the first insulating layer and a second via hole in the second insulating layer, wherein the first via hole and the second via hole are in direct communication with each other, and
   wherein the pixel electrode completely overlaps the reflective film.

2. The organic electroluminescent display device according to claim 1, wherein the reflective film and power supply line are formed of a metal having a high reflectivity and a low resistance.

3. The organic electroluminescent display device according to claim 1, wherein the power supply line is formed in a linear structure.

4. The organic electroluminescent display device according to claim 1, wherein the power supply line is formed in a grid structure.

5. The organic electroluminescent display device according to claim 1,
   wherein the first insulating layer is a passivation layer, and the second insulating layer is a planarized film.

6. The organic electroluminescent display device according to claim 1, wherein the second insulating layer has a thickness ranging from about 1 μm to about 2 μm.

7. An organic electroluminescent display device, comprising:
   a thin film transistor formed on an insulating substrate and having a source electrode and a drain electrode;
   a first insulating layer formed on the insulating substrate and having at least one contact hole for exposing at least one of the source electrode and the drain electrode;
   a first pixel electrode formed on the first insulating layer and electrically connected to one of the source electrode and the drain electrode through a first contact hole formed in the first insulating layer;
   a power supply line formed on the first insulating layer and electrically connected to the other of the source electrode and the drain electrode, which the first pixel electrode is not electrically connected to, through a second contact hole formed in the first insulating layer, the power supply line and the first pixel electrode both being formed above the first insulating layer;
   a second insulating layer formed on the insulating substrate having the first pixel electrode and the power supply line, and having a via hole for exposing a part of the first pixel electrode; and
   a second pixel electrode formed on the second insulating layer and electrically connected to the first pixel electrode through the via hole,
   wherein the power supply line is not formed directly on the same layer as a plurality of date lines, and the power supply line is not formed directly on the same layer as a plurality of data lines,
   wherein the first contact hole and the via hole are in direct communication with each other, and
   wherein the second pixel electrode completely overlaps the first pixel electrode.

8. The organic electroluminescent display device according to claim 7, wherein the first pixel electrode and the power supply line are formed of a metal having a high reflectivity and a lower resistance.

9. The organic electroluminescent display device according to claim 7, wherein the power supply line is formed in a linear structure.

10. The organic electroluminescent display device according to claim 7, wherein the power supply line is formed in a grid structure.

11. The organic electroluminescent display device according to claim 7, wherein the first insulating layer is a passivation layer, and the second insulating layer is a planarized film.

12. The organic electroluminescent display device according to claim 7, wherein the second insulating layer has a thickness ranging from about 1 μm to about 2 μm.

* * * * *